United States Patent
Langhans et al.

(10) Patent No.: US 9,817,057 B2
(45) Date of Patent: Nov. 14, 2017

(54) ELECTRICAL DEVICE WITH A PULSED POWER SUPPLY AND METHOD FOR TESTING THE POWER SUPPLY OF THE ELECTRICAL DEVICE

(71) Applicant: KUKA Laboratories GmbH, Augsburg (DE)

(72) Inventors: Michael Langhans, Balzhausen (DE); Sebastian Zehetbauer, Munich (DE)

(73) Assignee: KUKA Roboter GmbH, Augsburg (DE)

( * ) Notice: Subject to any disclaimer, the term of this patent is extended or adjusted under 35 U.S.C. 154(b) by 252 days.

(21) Appl. No.: 14/060,785

(22) Filed: Oct. 23, 2013

(65) Prior Publication Data

US 2014/0111244 A1 Apr. 24, 2014

(30) Foreign Application Priority Data

Oct. 23, 2012 (DE) .................. 10 2012 219 318

(51) Int. Cl.
*G01R 31/26* (2014.01)
*G01R 31/42* (2006.01)
(Continued)

(52) U.S. Cl.
CPC ......... *G01R 31/2621* (2013.01); *G01R 31/40* (2013.01); *G01R 31/42* (2013.01); *H02M 3/155* (2013.01)

(58) Field of Classification Search
CPC .................................................. H02M 3/155
(Continued)

(56) References Cited

U.S. PATENT DOCUMENTS 4,804,903 A * 2/1989 Yundt ................ G01R 19/0092
324/123 R
5,379,209 A * 1/1995 Goff .................... H02M 7/5387
318/599
(Continued)

FOREIGN PATENT DOCUMENTS

DE        43 21 040 A1    1/1995
DE     10 2006 039413 A1  3/2008

OTHER PUBLICATIONS

German Patent Office; Search report in German Patent Application No. 10 2012 219 318.9 dated Jun. 13, 2013; 5 pages.

*Primary Examiner* — Patrick Assouad
*Assistant Examiner* — Khristopher Yodichkas
(74) *Attorney, Agent, or Firm* — Wood Herron & Evans LLP (57) ABSTRACT

An electrical device having a clocked circuitry, and a method for testing the power supply unit of the electrical device. The electrical device comprises an electrical load, a clocked power supply unit, at least one pulse transformer and an evaluation device. The power supply unit comprises a power stack having at least one power semiconductor switch and is configured for generating a clocked voltage for the electrical load from an electric voltage based on an alternating on/off switching of the power semiconductor switch. The power stack exhibits at least one current path, through which an electric current flows during operation. The pulse transformer generates a signal assigned to the change in the charge and/or the direction of the electric current flowing through the current path. The evaluation device evaluates the signal coming from the pulse transformer and draws a conclusion regarding the operational reliability of the power semiconductor switch.

10 Claims, 3 Drawing Sheets

(51) Int. Cl.
*G01R 31/40* (2014.01)
*H02M 3/155* (2006.01)

(58) Field of Classification Search
USPC .................................................. 324/762.09
See application file for complete search history.

(56) References Cited

U.S. PATENT DOCUMENTS

| | | | | |
|---|---|---|---|---|
| 5,610,532 | A * | 3/1997 | Smith | H02H 1/0007 |
| | | | | 324/127 |
| 6,320,370 | B1 * | 11/2001 | Weggel | G01R 15/185 |
| | | | | 324/117 R |
| 6,534,967 | B1 * | 3/2003 | Weggel | G01R 19/2513 |
| | | | | 324/127 |
| 7,521,920 | B2 * | 4/2009 | Leibl | G01R 19/0038 |
| | | | | 324/120 |
| 2004/0207359 | A1 * | 10/2004 | Jahkonen | H02M 1/088 |
| | | | | 318/807 |
| 2011/0080125 | A1 * | 4/2011 | Shimada | H02P 21/0003 |
| | | | | 318/400.09 |
| 2011/0101906 | A1 * | 5/2011 | Tagome | H02K 3/28 |
| | | | | 318/722 |
| 2011/0156629 | A1 * | 6/2011 | Satou | B62D 5/0484 |
| | | | | 318/453 |
| 2011/0283815 | A1 * | 11/2011 | Langhans | B25J 13/085 |
| | | | | 73/862.338 |

* cited by examiner

ELECTRICAL DEVICE WITH A PULSED POWER SUPPLY AND METHOD FOR TESTING THE POWER SUPPLY OF THE ELECTRICAL DEVICE

REFERENCE TO RELATED APPLICATIONS

This application claims priority to German Patent Application No. 10 2012 219 318.9 filed on Oct. 23, 2012.

TECHNICAL FIELD

The invention concerns an electrical device, in particular an electrical machine having a clocked power supply unit and a method for testing the power supply unit for the electrical device.

BACKGROUND

Electrical devices, such as electrical machines, occasionally comprise a clocked power supply unit, which exhibits a power stack having at least one power semiconductor switch, and which is configured to generate a regulated voltage or a regulated current for an electrical load from an electric voltage based on an alternating switching on and off of the at least one power semiconductor switch.

SUMMARY

The objective of the invention is to create a possibility for testing the operational reliability of the power semiconductor switch in a clocked power supply unit during the running operation of the electrical device.

The objective of the invention is attained by means of an electrical device comprising
  an electrical load,
  a clocked power supply unit, exhibiting a power stack having at least one power semiconductor switch, and which is configured to generate an electrical supply voltage or an electric current for the electrical load from an electric voltage based on an alternating switching on and off of the at least one power semiconductor switch, wherein the power stack exhibits at least one current path, through which an electric current flows when the power supply unit is in operation,
  at least one pulse transformer, which is configured to generate a signal assigned to the change in the charge and/or the direction of the electric current flowing through the current path, and
  an evaluation device, which is configured to evaluate the signal coming from the pulse transformer, and to draw a conclusion regarding the operational reliability of the power semiconductor switch.

The objective of the invention is also attained by means of a method for testing the power supply unit of the electrical device according to the invention, having the following steps:
  alternating switching on and off of the at least one semiconductor switch,
  detecting a signal, assigned to the change in the charge and/or direction of the electric current through the path of the power stack of the power supply unit, by means of the pulse transformer, and
  evaluation of signal generated by means of the pulse transformer, and drawing a conclusion regarding the operational reliability of the power semiconductor switch based on the evaluated signal.

The device according to the invention is, for example, an electrical machine, such as a robot, by way of example, and comprises the clocked power supply unit, which is provided for supplying the electrical load of the device according to the invention with the electrical supply voltage, or the electric current, respectively. The electrical supply voltage is, in particular, a pulse regulated voltage, or, respectively, the electric current is, in particular, a pulse regulated electric current. The electrical load is, in particular, an inductive load, preferably an electromechanical brake.

Electromechanical brakes are used, e.g. with robots, for braking one of the links of the robot arm, in particular in an emergency situation. As a rule, robots comprise a robot arm and a control device. The robot arm exhibits numerous successively disposed links connected by means of joints, and electrical motors for moving the links in relation to one another. The inductive load can, for example, also be a relay or the primary winding of a power transformer, or, respectively, a power inductor for an arbitrary switching power supply or a motor in conjunction with a multi-phase bridge circuit (frequency converter).

The clocked power supply unit comprises the power stack, which exhibits the at least one power semiconductor switch, and is configured to generate the supply voltage, or the electric current, respectively, for the electrical load based on an alternating switching on and off of the at least one power semiconductor switch. The power stack is, for example, implemented as an inverter. The at least one power semiconductor switch is preferably designed as a power transistor, in particular as a FET or a MOSFET.

When the power supply unit, or the electrical device according to the invention, respectively, is in operation, the power semiconductor switch is switched on and off in an alternating manner. For this, the power supply unit comprises a suitable control electronics, as is known in principle to the person skilled in the art.

In order to check the operational reliability of the power semiconductor switch during the running operation of the electrical device, or the power supply unit thereof, respectively, according to the invention, the change to the electric current in at least one of the current paths for the power stack is evaluated. For this, the electrical device comprises, according to the invention, the at least one pulse transformer, the output signal of which is assigned to the change in said electric current, or the charge and/or direction thereof, respectively. Pulse transformers as such are known in principle to the person skilled in the art, and are generally transformers, or transducers, respectively. The electric current flowing through this current path constantly changes due to the alternating switching on and off of the power semiconductor switch and the selection of a suitable current path for the power stack, as long as the power semiconductor switch is functioning properly. An evaluation of the output signal from the pulse transformer therefore enables a conclusion to be drawn regarding the operational reliability of the power semiconductor switch. The processing of the output signal from the pulse transformer and the reaction depending thereon occurs, e.g. by means of suitable digital circuitry, e.g. microcontrollers, DSPs or FPGAs. If necessary, existing demands due to the safety architecture, e.g. dual channel design, or redundancy, can be satisfied by means of suitable wiring of the driver elements for a potentially existing bridge circuit, feedback paths from the pulse transformer, or digital control components.

According to a preferred embodiment of the electrical device according to the invention, the at least one power semiconductor switch is a part of the current path. Thus, basically the change to the charge and/or the direction of the electric current flowing through the power semiconductor switch is evaluated.

The power stack for the electrical device according to the invention is preferably designed as an H-bridge. This comprises, in particular, a first current path, through which a first electric current flows when the power supply unit is in operation, a second current path, through which a second electric current flows when the power supply unit is in operation, a third current path, through which a third electric current flows when the power supply unit is in operation, and a fourth current path, through which a fourth electric current flows when the power supply is in operation, wherein the first current path and the fourth current path are connected by a common node, and the second current path and the third current path are connected by a common node, between which the electrical load is connected, wherein a pulse transformer is assigned to at least the first, second, third and/or fourth current path, which is configured for generating a signal assigned to the change in the charge and/or direction of the electric current flowing through the respective current path, and the evaluation device is configured to evaluate the signal coming from the pulse transformer, and to draw a conclusion based on the evaluated signal regarding the operational reliability of the power semiconductor switch.

The power stack designed as an H-bridge can, e.g. be implemented such that each of the current paths comprises at least one power semiconductor switch. The power semiconductor switches are preferably transistors, e.g. FETs or MOSFETs.

When it is possible with the use thereof, then, according to a preferred embodiment of the electrical device according to the invention, the first current path and the second current path can each comprise at least one power semiconductor switch and the third current path and the fourth current path can each comprise a diode. By this means, a clocked current regulation for the electrical load, or the inductive load, respectively, can be implemented, in particular, through the clocked power supply unit. The magnetization of the inductive load occurs via paths having the two power semiconductor switches. The demagnetization of the inductive load occurs via the two diodes.

According to one embodiment of the electrical device according to the invention, at least one pulse transformer is assigned to each of the current paths, each of which is configured to generate a signal assigned to the change in the charge and/or direction of the electric current flowing through the respective current path, and the evaluation device is configured to evaluate the signal coming from the pulse transformer, and to draw a conclusion regarding the operational reliability of the power semiconductor switch based on the evaluated signal. As a result, the operational reliability of each individual power semiconductor switch can be checked.

According to another variant of the electrical device according to the invention, only the first and the second current paths are assigned a pulse transformer, or only the third and fourth current paths are assigned a pulse transformer. This variant is of interest, in particular, if the power stack is implemented as an H-bridge, and comprises diodes. Depending on the application, it can be advantageous to evaluate the change in current either when switching on or switching off the power semiconductor switch by means of an appropriate polarity of the pulse transformer. This can occur either directly in the path having the power semiconductor switches, or indirectly in the path having the diodes, or free-wheeling diodes, respectively, wherein a starting free-wheeling current provides information regarding a successful switching off of the power semiconductor switch.

BRIEF DESCRIPTION OF THE DRAWINGS

One embodiment example of the invention is depicted by way of example in the attached schematic drawings. They show.

DETAILED DESCRIPTION

Figure 1:
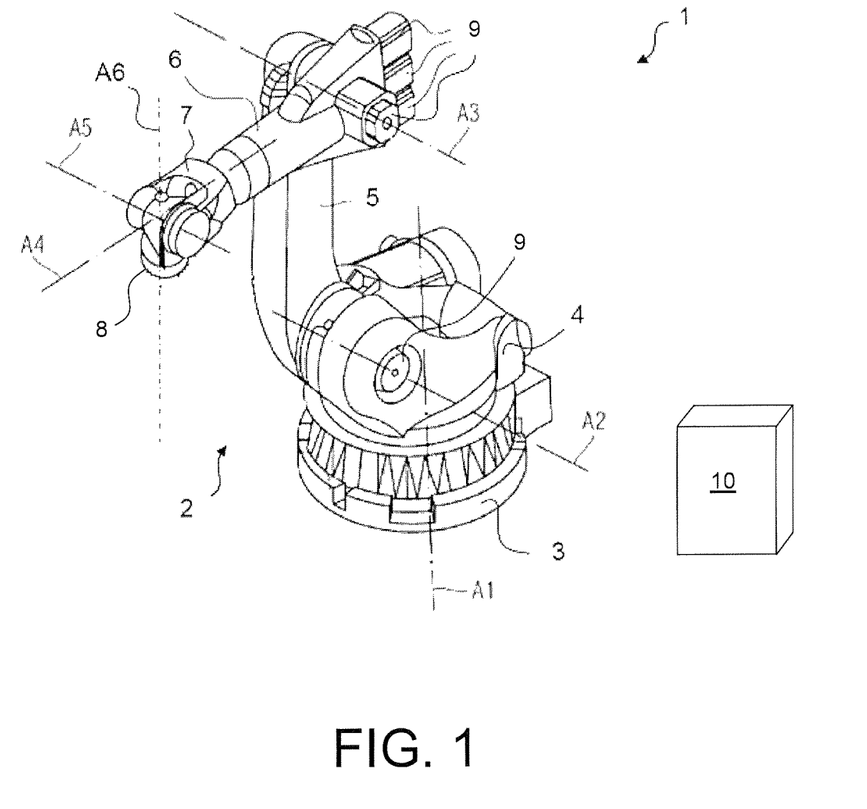
FIG. 1 a robot with a robot arm.

FIG. 1 shows a robot 1 with a robot arm 2, in a perspective depiction.

The robot arm 2 comprises, in the case of the present embodiment example, numerous successively disposed links, connected by means of joints. The links concern, in particular, a stationary or mobile frame 3 and a carousel 4 mounted such that it can pivot in relation to the frame 3 about a vertical axis A1. Other links of the robot arm 2 are, in the case of the present embodiment example, a rocker arm 5, a cantilever arm 6 and a preferably multi-axial robot hand 7 having an attachment device, implemented e.g. as a flange 8, for attaching an end effector, which is not shown in greater detail. The rocker arm 5 is mounted at its lower end, for example, on a rocker bearing head on the carousel 4 such that it can pivot about a preferably horizontal axis A2. At the upper end of the rocker arm 5, the cantilever arm 6 is mounted such that it can, in turn, pivot about a likewise preferably horizontal axis A3. The robot hand 7 with its preferably three axes A4, A5, A6, is mounted on the end of this cantilever arm.

In order to move the robot 1, or its robot arm 2, respectively, said robot comprises, in the generally known manner, an electrical drive connected to a control device 10. In FIG. 1, only a few of the electrical motors 9 for this electrical drive are shown, which are attached in or on the robot arm 2. Power electronics for the electrical drives are, e.g. disposed within a housing for a control cabinet, which is not shown in greater detail, in which, e.g. the control device 10 is also disposed. The electrical motors 9 in the case of the present embodiment example are three-phase motors, e.g. three-phase synchronous motors. The power electronics can, however, also be disposed in and/or on the robot arm 2.

The power electronics comprise, in the case of the present embodiment example, as is know in principle to the person skilled in the art, a rectifier, not shown in detail, which generates a DC voltage from the supply voltage, a DC link disposed downstream of the rectifier, likewise not shown in greater detail, having a DC link capacitor for smoothing the DC voltage, and numerous converters or inverters, disposed downstream of the DC link capacitor.

A computer program is run on the control device 10, which is, e.g. in the form of a computer, by means of which the control device 10 controls the robot 1 when it is in operation, such that the flange 8, or a so-called tool center point, executes a predetermined movement. If applicable, the control device 10 regulates the electrical drives, as is known in principle to the person skilled in the art. If applicable, the electrical drives are regulated electrical drives, and the control device 10 generates target signals for the regulated electrical drives, or their inverters, respectively.

Figure 2:
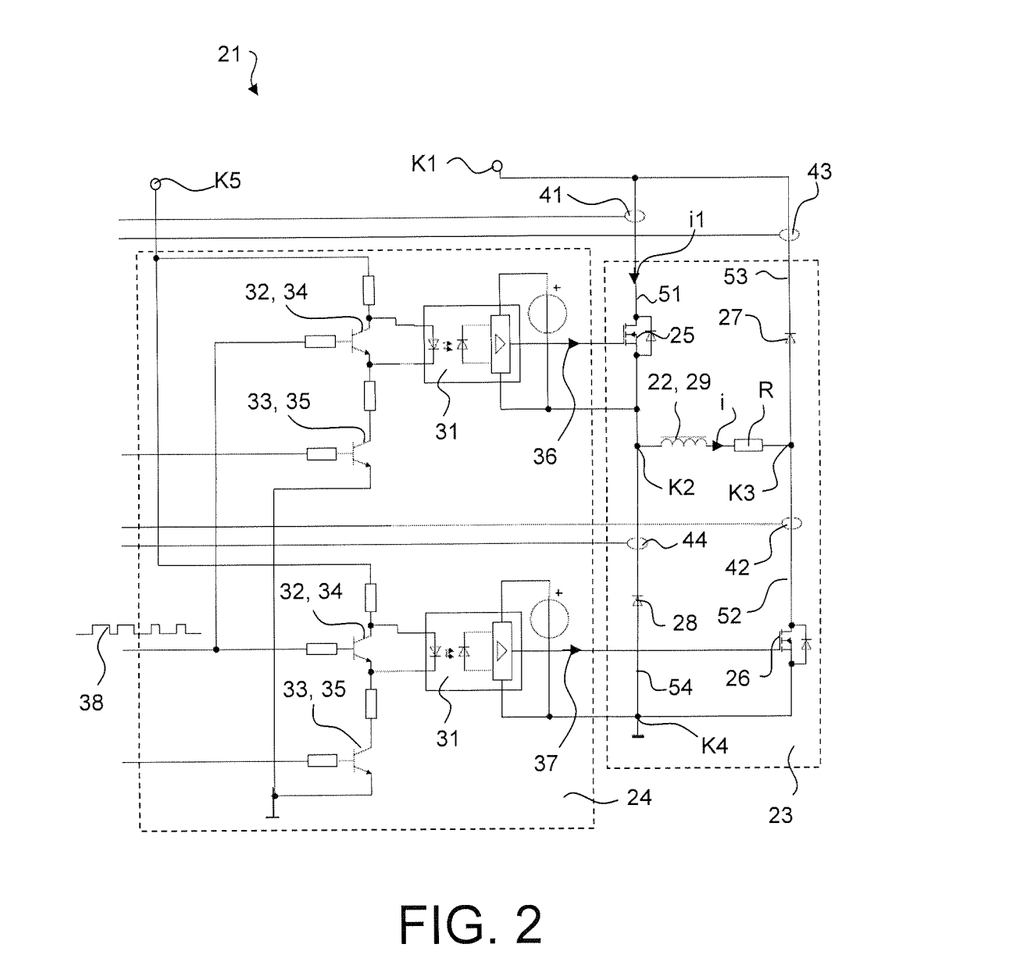
FIG. 2 in part, a circuit diagram for a clocked power supply unit for a brake for the robot arm, FIG. 3 a circuit diagram for an evaluation circuitry, and FIG. 4 signal, voltage and current courses.

In the case of the present embodiment example, the robot 1 comprises electromechanical brakes for braking the individual links. The brakes are implemented such that they are maintained in the released state by means of an inductor to which an electric current is applied. If the inductor is switched off, then the brakes are automatically triggered, and brake the link of the robot arm 2 that is assigned thereto. For this, the brakes comprise, for example, pre-tensioned springs. FIG. 2 shows, for example, the inductor 22 for applying the brakes provided on the carousel 4.

In order to maintain the brakes in their released state, or to bring the brakes from their triggered state to their released state, respectively, the robot 1, in the case of the present embodiment example, comprises clocked power supply units assigned to the brakes. The clocked power supply unit 21 assigned to the brake for the carousel 4 is shown in FIG. 2. The inductor 22 this represents an electrical load, in particular an inductive load 29 for the power supply unit 21.

The power supply unit 21 comprises, in the case of the present embodiment example, a power stack 23 and control electronics 24, configured for controlling the power stack 23.

In the case of the present embodiment example, the power stack 23 is structured as an H-bridge, and comprises numerous electrical paths, through which electric currents flow when the power supply unit 21 is in operation. It comprises, in the case of the present embodiment example, a first power semiconductor switch 25, a second power semiconductor switch 26, a first diode 27, and a second diode 28. The two power semiconductor switches 25, 26 are, for example, power transistors, which are preferably implemented using FET technology. Other components, e.g. power transistors using bipolar technology, can also be used however for the power semiconductor switches.

The power stack 23, or the H-bridge, respectively, is supplied, for example, by a first supply voltage, which is, in particular, an electrical DC voltage, and is applied to a first node K1. This is generated, for example, from the supply voltage by means of a rectifier and subsequent smoothing.

In the case of the present embodiment example, the topology of the power stack 23 structured as an H-bridge is as follows:

The first power semiconductor switch 25 is connected at one end to the first node K1 and at the other end to a second node K2, and is a component of a first current path 51, through which an electric current i1 flows when the power supply unit 21 is in operation. The first diode 27 is connected at one end to the first node K1 and connected, in particular in the locking direction, to a third node K3 and is a component of a third current path 53. The inductor 22 for the brake is connected between the second node K2 and the third node K3. In FIG. 2, an internal resistance R, in series with the inductor 22 for the brake, is also depicted.

The second power semiconductor switch 26, which is a component of a second current path 52, is connected at one end to the third node K3 and at the other end to a fourth node K4, which is grounded in the case of the present embodiment example. The second diode 28, which is a component of a fourth current path 54, is connected at one end to the second node K2 and, in particular in the locking direction, to the fourth node K4. Instead of the two diodes 27, 28, other power semiconductor switches, similar to the two power semiconductor switches 25, 26, can also be used.

In the case of the present embodiment example, the two power semiconductor switches 25, 26 are alternately switched on and off in the normal operation, i.e. in an operating state in which the brake is released, and thus its respective link is not braked. In particular, they are switched on and off by means of pulse width modulated signals. In the case of the present embodiment example it is provided that the brakes in their released state are to be subjected, by means of the power supply unit 21, to a reduced electric current (holding current) that is smaller than an electric current for bringing the brakes from their triggered, braking state to their released, non-braking state. As a result, the two power semiconductor switches 25, 26 are switched on and off in the appropriate manner by means of the control electronics 24, which generate the pulse width modulated signals.

In the case of the present embodiment example, the control electronics 24 comprises two opto-isolators 31, two first semiconductor switches 32 and two second semiconductor switches 33. The semiconductor switches 32, 33 are, in particular, implemented as first transistors 34 and as second transistors 35. These transistors 34, 35 are, for example, bipolar transistors.

In the case of the present embodiment example, the opto-isolators 31 comprise, in each case, an input stage implemented as a light transmitter, which emits light when an electric voltage is applied to the input of the respective opto-isolator 31. The light transmitters are implemented, in particular, as light emitting diodes. For the output stage, each opto-isolator 31 comprises an optical receiver, which converts the light emitted from the respective light transmitter to an electrical signal, which serves as the first pulse width modulated signal 36 for the first power semiconductor switch 25, or as the second pulse width modulated signal 37 for the second power semiconductor switch 25, respectively. In the case of the present embodiment example, the output stages, or the optical receivers, respectively, of the opto-isolators 31 each exhibit a photodiode coupled to the respective light transmitter and a driver stage disposed downstream of the photodiode. The output of one of the driver stages is connected to the gate for the first power semiconductor switch 25, and the output of the other driver stage is connected to the gate for the second power semiconductor switch 26, when these are FET transistors.

In the case of the present embodiment example one first semiconductor switch 32 is connected in parallel to an input stage of one of the opto-isolators 32 in each case, such that when the first semiconductor switch 32 is switched on, the input of the respective opto-isolator 31, or its light transmitter, respectively, is electrically short circuited. When the first semiconductor switch 32 is a bipolar first transistor 34, then, in particular, the collector and the emitter of this first transistor 34 are connected to the respective opto-isolator 31, and the first transistor 34 is switched on or off by triggering its base.

In the case of the present embodiment example, one of the second semiconductor switches 33 of the control electronics 24 is connected in series to one of the parallel connections from one of the opto-isolators 31, and connected, in each case, to one of the first semiconductor switches 32.

When the robot 2 is in operation, the control electronics 24 is supplied with voltage from the second supply voltage, which is applied to a fifth node K5. The serial connections, each of which exhibits one of the second semiconductor switches 33, and the parallel connections of one of the opto-isolators 31 and one of the first semiconductor switches 32, are supplied with energy by means of the second supply voltage.

In normal operation, the second semiconductor switches 33 are switched on, or, respectively, the second transistors 34 conduct electricity, and the first semiconductor switches 32 are switched off and on by means of pulse width modulation, such that the two power semiconductor switches 25, 26 are a triggered in accordance with the selected pulse width modulation.

The opto-isolators 31 trigger the two power semiconductor switches 25, 26 via the pulse patterns 38 of the pulse width modulation applied to the bases of the first transistors 34. In the case of the present embodiment example, the pulse patterns 38 on the bases of the first transistors 32 represent the inverted pulse pattern for the output stages of the opto-isolator 31 (pulse modulated signals 36, 37 of the opto-isolator 31), because, when the first semiconductor switch 32 on the light transmitter of the respective opto-isolator 31 is switched off, the second supply voltage is applied, and thus, when the first semiconductor switches 32 are switched off, the opto-isolators 31 switch the two power semiconductor switches 25, 26 on. If, in contrast, the respective first semiconductor switch 32 is switched on, then the light transmitter of the respective opto-isolator 31 is short circuited, and thereby deactivates the respective power semiconductor switch 26, 28.

Figure 4:
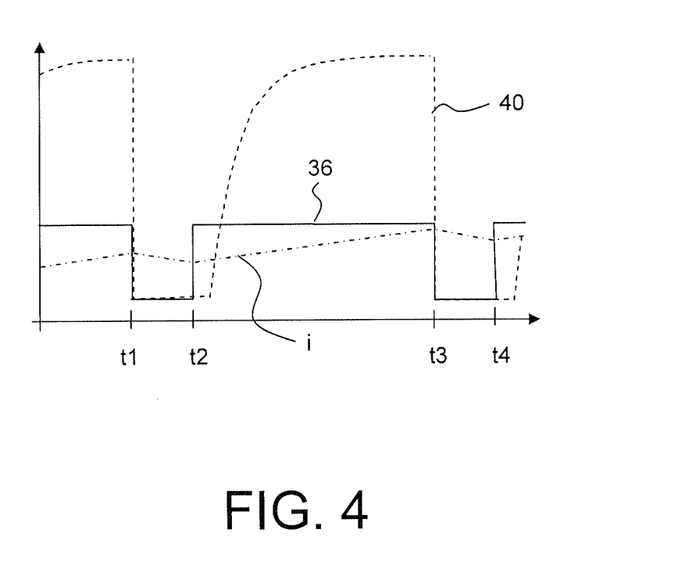

FIG. 4 shows the course of the first pulse modulated signal 36 for the first power semiconductor switch 25. At the point in time t1, this switches from logical "1" to logical "0" and thus switches the first power semiconductor switch 25 off. At the point in time t2, this switches from logical "0" to logical "1" and thus switches the first power semiconductor switch 25 on again. At the point in time t3, this switches from logical "1" to logical "0" and thus switches the first power semiconductor switch 25 out again, and at the point in time t4, this switches from logical "0" to logical "1" and thus switches the first power semiconductor switch 25 on. As a result, an electric current i flows through the inductive load 29, the course of which is shown in FIG. 4.

In the case of the present embodiment example the second semiconductor switches 33 are provided in order to automatically engage the brakes in the case, for example, of an emergency situation, in that they interrupt the supply of electrical energy to the opto-isolator 31.

Thus, by means of the clocked power supply unit 21, a clocked current regulation, in particular, is obtained for the inductive load 29. The magnetization of the inductive load 29 occurs via the first and second paths 51, 52 having the two power semiconductor switches 25, 26. The demagnetization of the inductive load 29 occurs, in the case of the present embodiment example, via the two diodes 27, 28, or through the use of other power semiconductor switches.

As has already been explained, the brakes are triggered when an electric current i no longer flows steadily through their inductors 22. This is obtained in that the two power semiconductor switches 25, 26 no longer steadily conduct a current.

In order to check the operational reliability of the two power semiconductor switches 25, 26 during the running operation, or normal operation, respectively, of the robot 1 as well, i.e. in order to also check the operational reliability of the two power semiconductor switches 25, 26 when the brakes have been released, the robot 1 comprises, in the case of the present embodiment example, a first pulse transformer 41, a second pulse transformer 42, a third pulse transformer 43 and a fourth pulse transformer 44.

The first pulse transformer 41 is provided for generating a signal corresponding to the change in the charge and/or the direction of the electric current i1 in the first path 51. The electric current i1 of the first path 51 flows through the first power semiconductor switch 25. The first pulse transformer 41 is connected, for example, between the first power semiconductor switch 25 and the first node K1.

The second pulse transformer 42 is provided for generating a signal corresponding to the change in the charge and/or the direction of the electric current through the second power semiconductor switch 26, or the electric current of the second path 52, respectively. The second pulse transformer 42 is connected, for example, between the power semiconductor switch 26 and the third node K3.

The third pulse transformer 43 is provided for generating a signal corresponding to the change in the charge and/or the direction of the electric current through the first diode 27, or the electric current of the third path 53, respectively. The third pulse transformer 43 is connected, for example, between the first diode 27 and the first node K1.

The fourth pulse transformer is provided for generating a signal corresponding to the change in the charge and/or the direction of the electric current through the second diode 28, or the electric current of the fourth path 54, respectively. The fourth pulse transformer 44 is connected, for example, between the second diode 28 and the second node K2.

Thus, by means of the pulse transformers 41-44, which, in particular, substantially represent inductive couplers between branches, or paths, respectively, of the H-bridge, a response can occur via the commutation procedures in the H-bridge.

In differing from the exemplary depiction, it is also possible that there are less than four pulse transformers present for acquiring complete information regarding the capability for switching the power semiconductor switches off.

Figure 3:
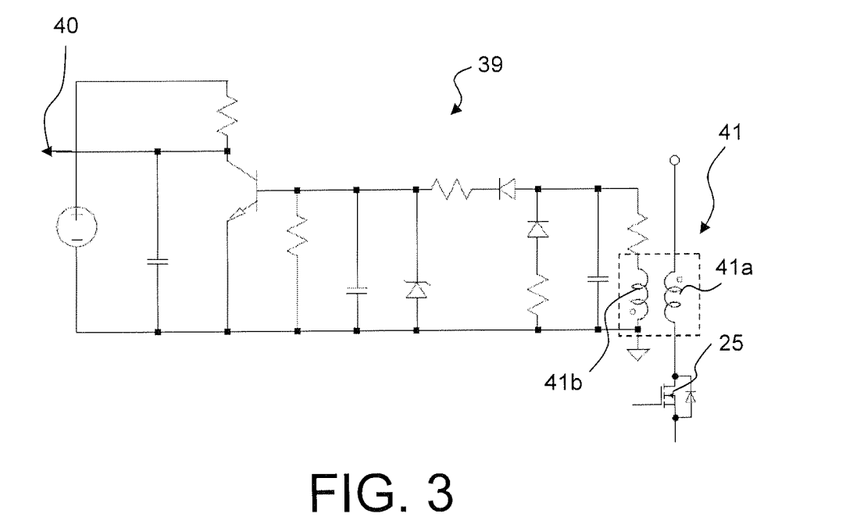

In the case of the present embodiment example the robot 2 comprises evaluation circuitries connected downstream of the pulse transformers 41-44, the evaluation circuitry 39 for the first pulse transformer 41 of which is shown in FIG. 3. Basically, pulse transformers 41 are transducers or transformers and exhibit at least one primary winding and at least one secondary winding. In FIG. 3, the at least one primary winding is indicated by the reference symbol 41a, and the at least one secondary winding is indicated by the reference symbol 41b. The output signal 40 from the evaluation circuitry 39, as well as the output signals of the other evaluation circuitries are transmitted to the control device 10 in the case of the present embodiment example, on which, in particular, a computer program runs, which evaluates the output signals 40 from the evaluation circuitry 39, which comprise data regarding the changes in the charges and/or directions of the electric currents in the electrical paths 51-54, in order to detect a defective power semiconductor switch 25, 26.

Due to the alternating switching on and off of the two power semiconductor switches 25, 26 in accordance with the pulse modulated signals 36, 27, the electric current i through the inductor 22, or the electric currents flowing through the two power semiconductor switches 25, 26 and the two diodes 27, 28, respectively, and thus the output signals from the pulse transformers 41-44 as well, change with each switching. FIG. 4 shows the course of the output signal 40 from the evaluation circuitry 39 assigned to the first pulse transformer 41, which changes in accordance with the pulse pattern of the pulse width modulation as long as the first power semiconductor switch 25 is functioning properly.

What is claimed is:

1. An electrical device, in particular an electrical machine, comprising
an electrical load,
a controller that generates a pulse width modulated signal having a pulse pattern,
a clocked power supply unit, comprising a power stack including a semiconductor switch, the power supply unit configured to generate an electrical supply voltage or an electric current for the electrical load from an electric voltage based on an alternating switching on and off of the semiconductor switch by the pulse width modulated signal, wherein the power stack exhibits at least one current path through which the electric current flows when the power supply unit is in operation,
a pulse transformer connected to a current path of the semiconductor switch, the pulse transformer configured to generate an output signal corresponding to a change of at least one of an absolute value or a direction of the electric current flowing through the current path of the semiconductor switch,
an evaluation circuit connected to the pulse transformer that couples the output signal to the controller,
wherein the controller is configured to determine the semiconductor switch is functioning properly if the output signal changes in accordance with the pulse pattern of the pulse width modulation signal.

2. The electrical device according to claim 1, in which the power stack in the form of an inverter, and/or in which the semiconductor switch in the form of a power transistor, is designed, in particular, as a FET or a MOSFET, and/or in which the electrical load is implemented as an electrical inductive load.

3. The electrical device according to claim 2, in which the inductive load is implemented as an electromechanical brake.

4. The electrical device according to claim 1, in which the semiconductor switch is a component of a first current path of the at least one current path.

5. The electrical device according to claim 1, the power stack of which is designed as an H-bridge, which exhibits a first current path, through which a first electric current flows when the power supply unit is in operation, a second current path, through which a second electric current flows when the power supply unit is in operation, a third current path, through which a third electric current flows when the power supply unit is in operation, and a fourth current path, through which a fourth electric current flows when the power supply unit is in operation, wherein the first current path and the fourth current path are connected by a first common node and the second current path and the third current path are connected by a second common node, between which the electrical load is connected, wherein the pulse transformer is assigned to one of the first current path, the second current path, the third current path, or the fourth current path, the pulse transformer being configured for generating the output signal corresponding to the change of the absolute value and/or the direction of the electric current flowing through the respective current path, and the controller is configured to determine a respective semiconductor switch is functioning properly if the respective output signal changes in accordance with the pulse pattern of the pulse width modulation signal.

6. The electrical device according to claim 5, in which each of the current paths comprises one of the respective semiconductor switches.

7. The electrical device according to claim 5, in which the first current path and the second current path each comprises at least one semiconductor switch and the third current path and the fourth current path comprise a diode.

8. The electrical device according to claim 5, in which each of the current paths is assigned a respective pulse transformer, each of which is configured for generating a respective output signal corresponding to the change of the absolute value and/or the direction of the electric current flowing through the respective current path, and the controller is configured to determine the respective semiconductor switches are functioning properly if the respective output signals change in accordance with the pulse pattern of the pulse width modulation signal.

9. A method for testing a power supply unit of an electrical device having an electrical load, the power supply unit comprising a clocked power stack including a semiconductor switch and a current path through which an electric current flows when the power supply unit is in operation, the method comprising:
generating a pulse width modulated signal having a pulse pattern,
alternating switching on and off the semiconductor switch using the pulse width modulated signal to generate an electrical supply voltage or the electric current for the electrical load from an electric voltage,
generating, by a pulse transformer, an output signal corresponding to a change of at least one of an absolute value or a direction of the electric current through the current path of the semiconductor switch, and
determining the semiconductor switch is functioning properly if the output signal changes in accordance with the pulse pattern of the pulse width modulation signal.

10. An electrical device, in particular an electrical machine, comprising
an electrical load,
a controller that generates a pulse width modulated signal having a pulse pattern,
a clocked power supply unit, designed as an H-bridge, having at least two power semiconductor switches, the power supply unit exhibits a first current path, through which a first electric current flows when the power supply unit is in operation, a second current path, through which a second electric current flows when the power supply unit is in operation, a third current path, through which a third electric current flows when the power supply unit is in operation, and a fourth current path, through which a fourth electric current flows when the power supply unit is in operation, wherein the first current path and the fourth current path are connected by a first common node and the second current path and the third current path are connected by a second common node, between which the electrical load is connected, and in which a first semiconductor switch is a component of the first current path, and a second semiconductor switch is a component of the second current path,
a separate pulse transformer assigned to each of the current paths, each pulse transformer configured for generating an output signal corresponding to a change of an absolute value and/or a direction of the electric current flowing through the respective current path; and
an evaluation circuit connected to each pulse transformer that couples the corresponding output signal to the controller, wherein the controller is configured to determine the semiconductor switches are functioning properly if the output signals change in accordance with the pulse pattern of the pulse width modulation signal.

* * * * *